United States Patent [19]

Botez et al.

[11] Patent Number: 5,063,570
[45] Date of Patent: Nov. 5, 1991

[54] SEMICONDUCTOR LASER ARRAYS USING LEAKY WAVE INTERARRAY COUPLING

[75] Inventors: Dan Botez, Redondo Beach; Luke J. Mawst, Torrance; Gary L. Peterson, Long Beach, all of Calif.

[73] Assignee: TRW Inc., Redondo Beach, Calif.

[21] Appl. No.: 604,315

[22] Filed: Oct. 29, 1990

[51] Int. Cl.⁵ .............................................. H01S 3/19
[52] U.S. Cl. ...................................... 372/50; 372/45; 372/46; 372/48
[58] Field of Search ...................... 372/50, 45, 46, 48

[56] References Cited

U.S. PATENT DOCUMENTS

| | | | |
|---|---|---|---|
| 4,764,935 | 8/1988 | Wilcox et al. | 372/50 |
| 4,831,630 | 5/1989 | Scifres et al. | 372/50 |
| 4,860,298 | 8/1989 | Botez et al. | 372/50 |
| 4,868,839 | 9/1989 | Simmons et al. | 372/50 |
| 4,903,274 | 2/1990 | Taneya et al. | 372/48 |

Primary Examiner—Georgia Epps
Attorney, Agent, or Firm—Noel F. Heal; Sol L. Goldstein

[57] ABSTRACT

A semiconductor laser array of antiguides having a large number of antiguide elements to provide relatively high optical power output with a high degree of coherence and array mode discrimination. The antiguide elements are grouped into array cells that are separated by interarray regions having a width and refractive index selected to produce a resonance condition in the 0°-phase-shift array mode. Each array cell is also designed to operate in the resonant condition, and losses in the interarray regions discriminate against modes other than the 0°-phase-shift mode. The entire group of cells operates as a high-power, coherent ensemble, without the degradation of mode discrimination and beam quality usually associated with large numbers of waveguide elements.

8 Claims, 2 Drawing Sheets

SEMICONDUCTOR LASER ARRAYS USING LEAKY WAVE INTERARRAY COUPLING

BACKGROUND OF THE INVENTION

Cross-Reference to Related Applications

This is related to the subject matter of application Ser. No. 07/254,905 filed Oct. 7, 1988, by Dan Botez et al., entitled "Semiconductor Laser Array Having High Power and High Beam Quality."

BACKGROUND OF THE INVENTION

This invention relates generally to semiconductor diode lasers and, more particularly, to one-dimensional arrays of semiconductor diode lasers fabricated as monolithic structures. Single-element diode lasers are limited in power to outputs of the order of 30 milliwatts (mW), but arrays of diode lasers have been designed to provide output powers of hundreds of milliwatts. Such high power outputs are useful in optical communications systems, laser printers and other applications. The present invention seeks to further advance the output optical power of semiconductor laser arrays, to approximately 5 watts and above.

A survey of the state of the art of phaselocked laser arrays can be found in a paper entitled "Phase-Locked Arrays of Semiconductor Diode Lasers," by Dan Botez and Donald Ackley, IEEE Circuits and Devices Magazine, Vol. 2, No. 1, pp. 8–17, January 1986.

By way of general background, a semiconductor diode laser is a multilayered structure composed of different types of semiconductor materials, chemically doped with impurities to give them either an excess of electrons (n type) or an excess of electron vacancies or holes (p type). The basic structure of the semiconductor laser is that of a diode, having an n type layer, a p type layer, and an undoped active layer sandwiched between them. When the diode is forward-biased in normal operation, electrons and holes recombine in the region of the active layer, and light is emitted. The layers on each side of the active layer usually have a lower index of refraction than the active layer, and function as cladding layers in a dielectric waveguide that confines the light in a direction perpendicular to the layers. Various techniques are usually employed to confine the light in a lateral direction as well, and crystal facets are located at opposite ends of the structure, to provide for repeated reflections of the light back and forth in a longitudinal direction in the structure. If the diode current is above a threshold value, lasing takes place and light is emitted from one of the facets, in a direction generally perpendicular to the emitting facet.

Various approaches have been used to confine the light in a lateral sense within a semiconductor laser, i.e. perpendicular to the direction of the emitted light and within the plane of the active layer. If a narrow electrical contact is employed to supply current to the device, the lasing action will be limited to a correspondingly narrow region, in a process generally referred to as "gain guiding." At high powers, gain-guided devices have strong instabilities and produce highly astigmatic, double-peaked beams. For most high-power semiconductor laser applications there is also a requirement for a diffraction-limited beam, i.e. one whose spatial spread is limited only by the diffraction of light, to a value roughly proportional to the wavelength of the emitted light divided by the width of the emitting source. Because of the requirement for a stable diffraction-limited beam, most research in the area has been directed to index-guided lasers. In these, various geometries are employed to introduce dielectric waveguide structures for confining the laser light in a lateral sense, i.e. perpendicular to the direction of light emission and generally in the same plane as the active layer.

One type of lateral index guiding in laser arrays is known as positive-index guiding, i.e. the refractive index is highest in regions aligned with the laser elements and falls to a lower value in regions between elements, thereby effectively trapping light within the laser elements. Another type of index guiding is referred to as negative-index guiding, or antiguiding, wherein the refractive index is lowest in the regions aligned with the laser elements and rises to a higher value between elements. Some of the light encountering the higher refractive index material will leak out of the lasing element regions; hence the term leaky-mode laser array is sometimes applied.

The present invention, as well as that of the cross-referenced application, employs antiguides or leaky waveguides in an array. The cross-referenced application discloses an array of antiguides in which the interelement spacing and the effective transverse refractive index of the interelement regions are selected to yield a resonance condition in which there is strong coupling between all elements of the array and a high degree of device coherence. More specifically, the resonance condition is achieved when the interelement spacing is approximately equal to an odd multiple of the half-wavelength of laterally traveling waves between the waveguide elements.

In general, an array of laser emitters can oscillate in one or more of multiple possible configurations, known as array modes. In what is usually considered to be the most desirable array mode, all of the emitters oscillate in phase. This is known as the fundamental, in-phase, or 0°-phase-shift array mode, and it produces a far-field pattern in which most of the energy is concentrated in a single lobe, the width of which is limited, ideally, only by the diffraction of light. When adjacent laser emitters are 180° out of phase, the array operates in the 180°-phase-shift array mode, or out-of-phase array mode, and produces two relatively widely spaced lobes in the far-field distribution pattern. Multiple additional modes exist between these two extremes, depending on the phase alignment of the separate emitters. Many laser arrays operate in two or three array modes simultaneously and produce one or more beams that are typically two or three times wider than the diffraction limit.

One of the embodiments disclosed in the cross-referenced application has some similarity to the present invention in that it operates in or close to the resonance condition for the 0°-phase-shift array mode of operation, and thereby achieves strong coupling between all elements of the array and a high degree of device coherence. The disclosed array also includes means for suppressing operation in the out-of-phase array mode.

The device described in the cross-referenced application operates at relatively high powers and achieves strong interelement coupling and device coherence, with some power limitation. The output power of a laser array can be increased, as one might expect, by increasing the number of elements in the array. However, there is an accompanying disadvantage to increasing the number of elements, in that the degree of discrimination between array modes is inversely proportional to the number of array elements. Basically, discrimination between the 0°-phase-shift array mode and the other array modes is primarily achieved as a result of radiation losses at the edges of the array. As the number of array elements is increased, the edge radiation losses decrease, and the degree of discrimination between the 0°-phase-shift and the other modes is also diminished. Without this discrimination, the array output will have lower beam quality because of the presence of array modes other than the desired mode.

Therefore, there is a need for an improved laser array of antiguides that can be operated at higher power levels without degradation of its ability to discriminate between array modes. The present invention satisfies this need.

SUMMARY OF THE INVENTION

The present invention resides in a semiconductor laser array of antiguides, in which the number of array elements may be increased without significantly affecting the ability of the array to discriminate between the 0°-phase-shift and other array modes of operation. Briefly, and in general terms, the device of the invention comprises a number of array cells each of which has multiple negative-index waveguides configured to operate at or near a resonance condition, the array cells being separated by interarray regions in such a manner that the whole combination of arrays also operates at or near the resonance condition.

More specifically, the structure of the invention includes means for producing lasing action in the structure, including a substrate, an active semiconductor layer and surrounding cladding layers successively formed on the substrate, at least two electrodes formed on opposite faces of the substrate, for applying a voltage across the active layer, and a pair of reflective facets, at least one of which is an emitting facet, formed at opposite ends of the array structure. Each array cell has a plurality of negative-index waveguides with parallel longitudinal axes, the waveguides operating in or near a 0°-phase-shift-array-mode resonance condition in which there is strong coupling between all waveguides in each array cell and a high degree of array coherence throughout the cell. Each of the interarray regions is wider than the interelement spacings between the waveguides in each array cell, and the width and transverse refractive index of the region are chosen to produce a 0°-phase-shift-array-mode resonance condition in the entire device. Thus the device operates with strong coupling between the array cells and a high degree of device coherence among all of the array cells.

The structure of the invention also includes means for introducing losses in the interarray regions. Since the 0°-phase-shift array mode develops practically zero intensity in the interarray regions, the losses inhibit operation in array modes other than the 0°-phase-shift mode. Therefore, high optical powers are achieved with a large total number of waveguides, but without adversely affecting array mode discrimination.

Even more specifically, the resonance condition is achieved by configuring the waveguides to have an interelement spacing approximately equal to an odd number of half-wavelengths of laterally traveling waves potentially generated in interelement regions of the array cells, so that each array cell is operated in or near the resonant condition. Further, the interarray regions have a lateral width approximately equal to an odd number of half-wavelengths of laterally traveling waves in the interarray regions, so that the entire plurality of array cells is also operated in or near the resonant condition.

Although the dimensional limits of the interarray regions are not yet known with certainty, it appears that a width of between 10 and 60 microns (micrometers) produces satisfactory results. As the width of the interarray regions is increased, there is an increasing tendency for light to leak from the regions in a generally longitudinal direction. Another aspect of the invention involves the use of reflective means located at the ends of the interarray regions, to reflect light that would otherwise leak longitudinally from the structure, back into the interarray regions.

It will be appreciated from the foregoing that the present invention represents a significant advance in the field of high-power semiconductor laser arrays. In particular, the invention permits the use of large numbers of negative-index waveguides without adversely affecting array-mode discrimination or beam quality. Other aspects and advantages of the invention will become apparent from the following more detailed description, taken in conjunction with the accompanying drawings.

DESCRIPTION OF THE PREFERRED EMBODIMENT

Figure 1:
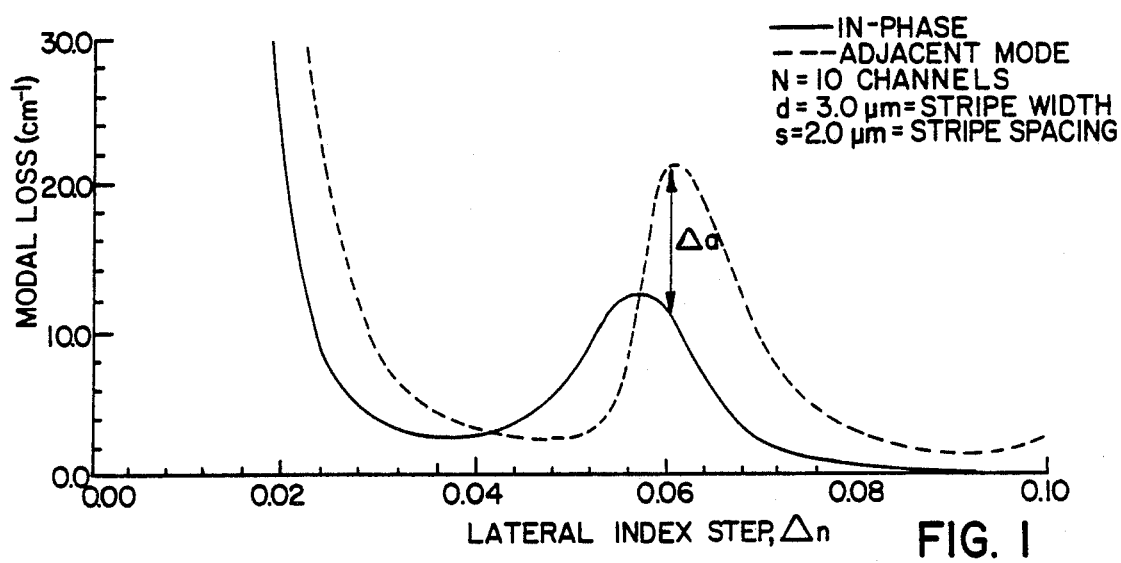
FIG. 1 is a graph showing, for a ten-element resonant antiguide array, the modal loss for the inphase mode and the next adjacent mode, plotted as a function of lateral index difference.
Figure 2:
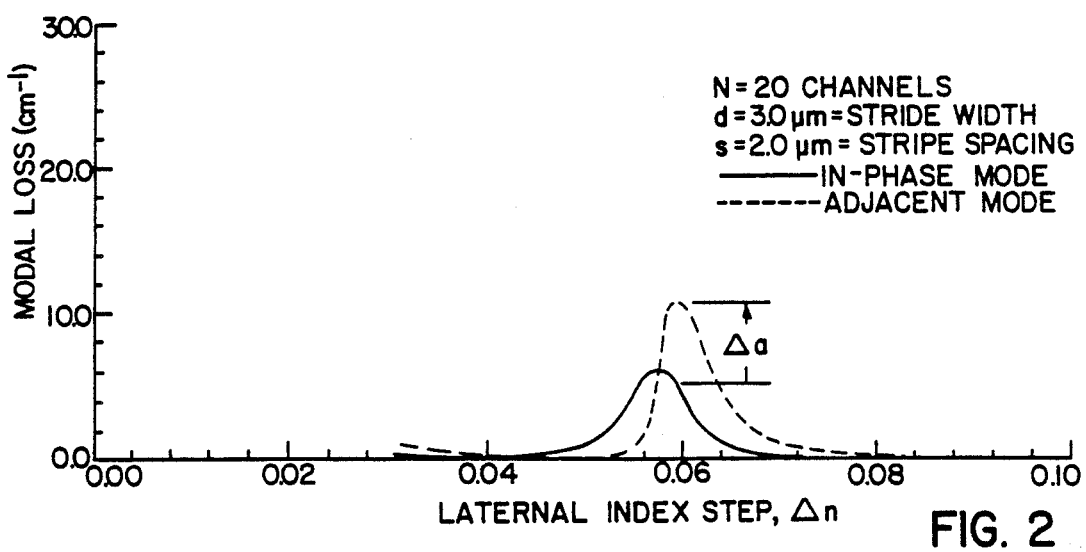
FIG. 2 is a graph similar to FIG. 1, but for a twenty-element array.

As shown in the drawings for purposes of illustration, the present invention is concerned with an improved semiconductor array of antiguides, wherein the number of waveguide elements can be increased without any adverse effect on mode discrimination and beam quality. FIGS. 1 and 2 show how mode discrimination in an array of antiguides is affected by increasing the number of array elements from ten to twenty. It can be seen from FIG. 1 that the modal loss for the in-phase mode has a peak value of approximately 12 cm$^{-1}$, and that the modal loss for the next adjacent mode has a peak value of approximately 21 cm$^{-1}$. The mode discrimination, measured by the difference between these values, is approximately 9 cm$^{-1}$. For the twenty-element array the peak values, and their difference, are reduced by a factor of approximately two. This effect of increasing the number of array elements has until now placed a practical limit on the number of elements that can be designed into such an array.

In accordance with the present invention, a high-power semiconductor laser array of antiguides is formed with a large number of array elements grouped into a number of array cells, which are separated laterally by an interarray leaky-wave coupling region between each pair of adjacent array cells. The coupling region has a width greater than the interelement periodic spacing, and is chosen to provide operation at or close to a resonance condition for leaky lateral waves. The structure of the invention is, therefore, a resonantly coupled set of resonant array cells. That is to say, each array cell has its interelement spacing chosen to provide resonant operation, and the interarray spacing is also chosen for resonant operation.

Figure 3:
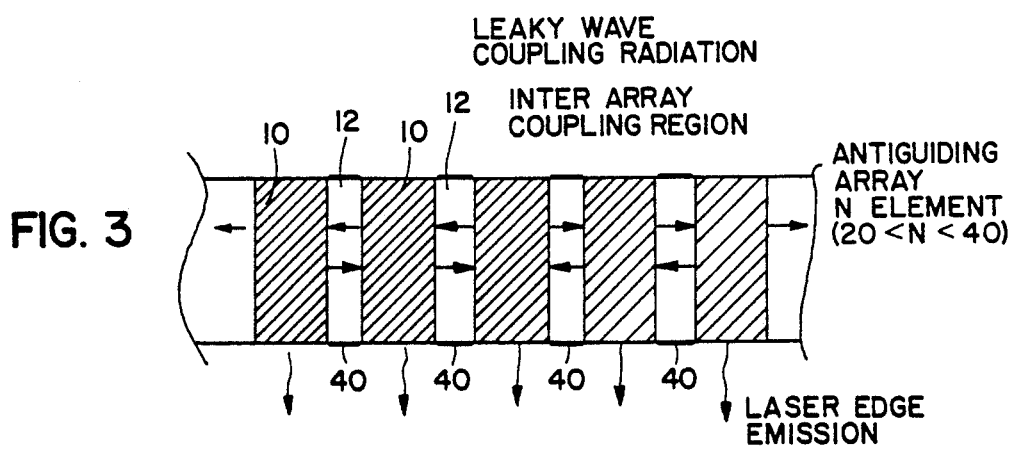
FIG. 3 is a diagrammatic plan view showing multiple laser array cells separated by interarray regions in accordance with the present invention.

FIG. 3 shows in diagrammatic form a number of array cells, indicated by reference numeral 10, spaced apart by interarray coupling regions 12. Each array cell 10 provides laser edge emission of light in a longitudinal direction. Further, light from each array cell 10 propagates in a generally lateral direction across an interarray coupling region 12 and is fed into an adjacent array cell. This leaky-wave radiation essentially injection locks all of the array cells together to obtain a coherent ensemble. If the interarray region has the appropriate lateral width and refractive index, such that it contains approximately an odd number of half-wavelengths of the leaky wave, then a resonance condition exists and the gap region effects complete transmission of the leaky wave between adjacent array cells. This resonance condition allows for efficient coupling of many array cells, resulting in a large-aperture, coherent source.

Figure 4:
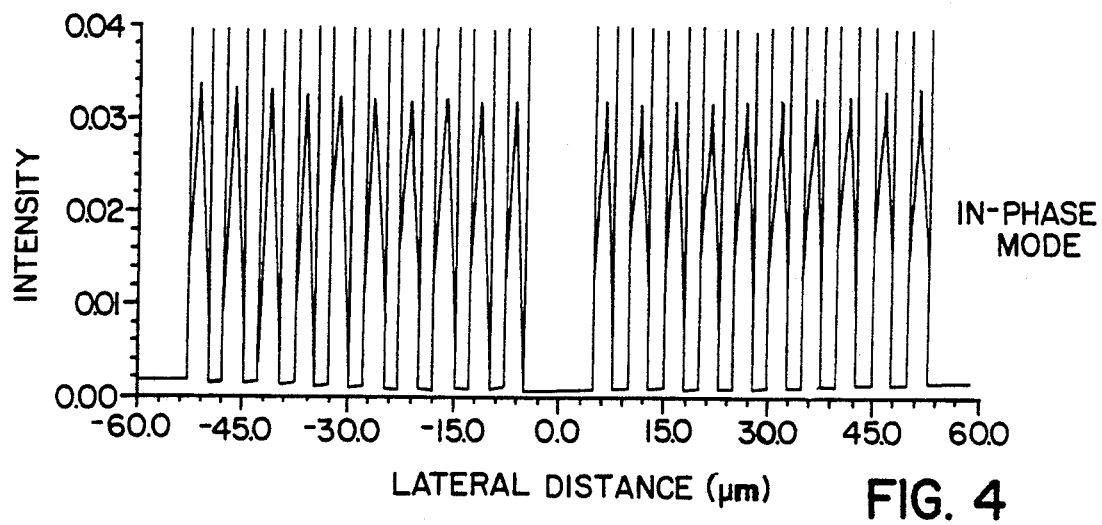
FIG. 4 is a graph showing the calculated nearfield intensity pattern, in the in-phase array mode, for two ten-element arrays coupled in the manner of the invention.
Figure 5:
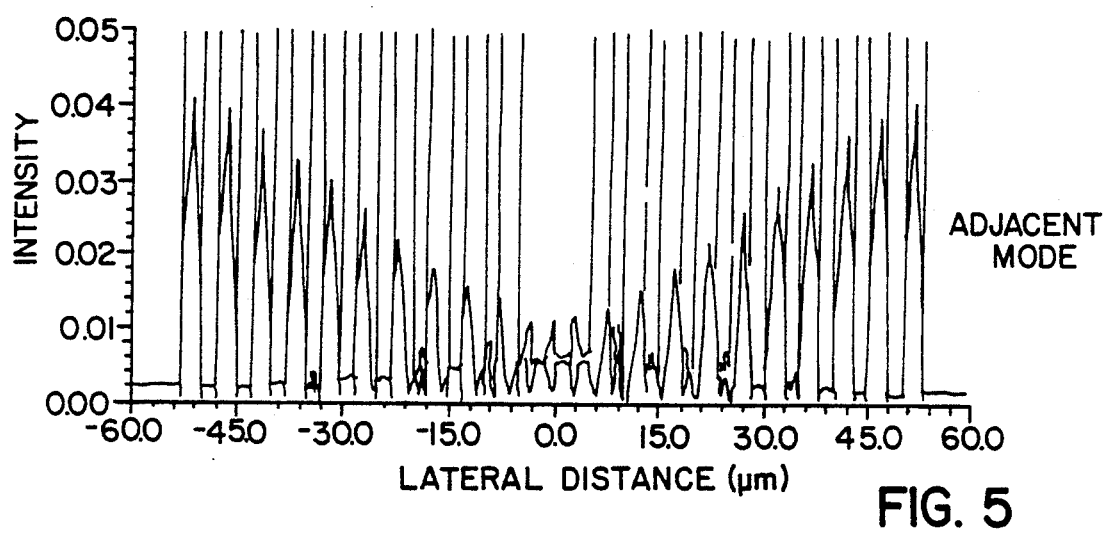
FIG. 5 is a graph similar to FIG. 4, but showing the near-field intensity pattern in the next adjacent mode to the in-phase array mode.

FIGS. 4 and 5 show the mode discrimination mechanism that is inherent in this leaky-wave coupling technique. FIG. 4 shows the calculated intensity for the in-phase mode as measured across two adjacent array cells separated by an interarray coupling region. Because each cell is operated at or near the resonance condition, the near-field intensity distribution is substantially uniform across each cell, and there is little or no intensity in the interarray gap. For the adjacent array mode, however, FIG. 5 shows that the intensity is not uniform. Instead the intensity distribution falls off toward the center of the pair of array cells, but still has a substantial magnitude in the interarray gap. Mode discrimination is obtained because of the existence of an inherent transverse radiation loss in the interarray region, and may be further increased by the introduction of an absorption loss between the array cells. Both of these techniques were disclosed in the cross-referenced application, which is incorporated by reference into this specification. In addition, the overlap of the in-phase mode field with the high-gain regions (elements in the array regions) is larger than that for other array modes, since the latter have a larger field intensity in the interelement (low-gain) regions of the array. The in-phase mode then has a higher modal gain and is favored to oscillate.

The introduction of losses in the interarray region does not affect operation in the in-phase or 0°-phase-shift array mode, since there is little or no intensity of radiation for this mode in the interarray region. However, for the adjacent mode and other array modes the presence of transverse losses in the interarray region results in suppression of these modes.

The illustration of FIGS. 4 and 5 can be extrapolated to more than two array cells, the only limitation being that there should be an even number of array cells. For an odd number or array cells, such as three, the minimum intensity for the adjacent mode will not be located at an interarray gap, and introducing losses in the interarray gaps will not result in a desired level of mode discrimination.

Figure 6:
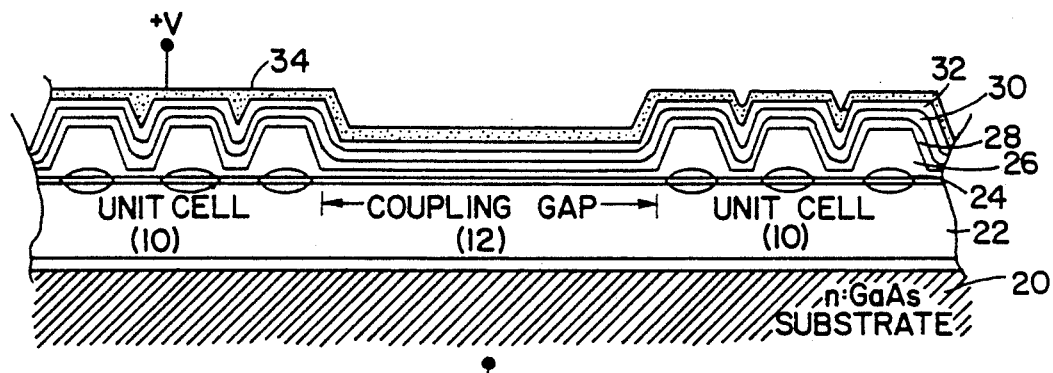
FIG. 6 is a fragmentary cross-sectional view of a device in accordance with the invention, showing portions of two adjacent array cells separated by an interarray region.

FIG. 6 shows a typical cross section of the device of the invention. The structure includes a substrate 20 if n type gallium arsenide on which is formed a first cladding layer 22 of n type $Al_{0.40}Ga_{0.60}As$, a separate confinement heterostructure 24 made of $Al_{0.20}Ga_{0.80}As$ confining layers surrounding a quantum well active layer of gallium arsenide, and a second cladding layer 26 of p type $Al_{0.40}Ga_{0.60}As$ which has regions of increased depth over the quantum well lasing regions. Over the second cladding layer is a sandwich of three additional p type layers, including first a layer 28 of p type $Al_{0.18}Ga_{0.82}As$, then a layer 30 of p type $Al_{0.40}Ga_{0.60}As$, and finally a layer 32 of p+ type gallium arsenide. In the illustrated portion of the structure, a metallization layer 34 covers the coupling gap 12 and two adjacent array cells 10. FIG. 6 is exemplary only. Other antiguide structures, such as the ones shown in U.S. Pat. No. 4,860,298 to Botez et al. "Phase-Locked Array of Semiconductor Lasers Using Closely Spaced Antiguides," may also be used. U.S. Pat. No. 4,860,298 is hereby incorporated by reference into this specification.

The present invention has the advantage that the total number of waveguide elements can be increased many times, beyond the practical limit imposed by the degradation of beam quality that previously accompanied an increase in the number of elements. Therefore, the power output of the device may be substantially increased without detracting from the array mode discrimination inherent in resonant operation of arrays of antiguides. The use of multiple array cells increases the potential power output of semiconductor laser arrays to approximately 5 watts and possibly higher.

Depending on the lateral width selected for the interarray gaps 12, light propagated into the gaps can leak out in a longitudinal direction. This effect becomes more pronounced as the gap width is increased. Ideally, all of the light radiated from one array cell into an interarray gap should be coupled into the next adjacent array cell. For further improvement of the device, the structure of the invention may also include reflective surfaces appropriately positioned to reflect longitudinally propagating light back into the interarray gap region. These are shown diagrammatically at 40 in FIG. 3. The reflective surfaces 40 may take the form of preferentially etched mirror surfaces, with high-reflectivity coatings, extending laterally across the interarray regions.

The invention may be used in conjunction with other means for suppressing unwanted array modes. For example, the cross-referenced application also discloses a technique in which there are two laser arrays separated longitudinally by a diffraction region having a length that is an odd multiple of half-Talbot lengths. The device makes use of the Talbot effect, a diffraction phenomenon that can be used to produce an image of an array of light emitters at a predictable distance from the emitters. High powers and coherent operation can be obtained by using the Talbot effect in combination with some means internal to the laser structure for suppressing unwanted array modes of operation. The present invention provides a high-power coherent light source by means of multiple array cells that are individually designed to operate at or near the resonance condition, and are coupled by interarray coupling regions that are also designed for resonant operation. The Talbot effect may be used to further enhance the optical power output or the beam quality produced by this structure, but does not appear to be necessary for most applications.

It will be appreciated from the foregoing that the present invention represents a significant advance in the field of semiconductor laser arrays. In particular, the invention provides a technique for increasing the total number of waveguide elements without adversely affecting array mode discrimination. Therefore, very high optical powers can be obtained from a single monolithic device, operating coherently in a single array mode. It will also be appreciated that, although an embodiment of the invention has been described in detail for purposes of illustration, various modifications may be made without departing from the spirit and scope of the invention. Accordingly, the invention is not to be limited except as by the appended claims.

We claim:

1. A semiconductor laser array structure, comprising:
    means for producing lasing action in the structure, including a substrate, an active semiconductor layer and adjacent cladding layers successively formed on the substrate, at least two electrodes formed on opposite faces of the substrate, for applying a voltage across the active layer, and a pair of reflective facets, at least one of which is an emitting facet, formed at opposite ends of the array structure;
    a plurality of negative-index waveguides with parallel longitudinal axes, the waveguides being arranged in a smaller number of array cells, which operate in or near a 0°-phase-shift-array-mode resonance condition in which there is strong coupling between all waveguides in each array cell and a high degree of array cell coherence; and
    a plurality of interarray regions, each of which is wider than interelement spacings between the waveguides in each array cell, and separates adjacent array cells, wherein each interarray region has a lateral width chosen to produce a 0°-phase-shift-array-mode resonance condition in the entire device, in which there is strong coupling between the array cells, a high degree of device coherence among all of the array cells, and a virtually uniform near-field intensity profile;
    and wherein the structure further includes in the interarray regions means for introducing losses, which inhibit operation in array modes other than the 0°-phase-shift mode, whereby high optical powers are achieved without adversely affecting array mode discrimination.

2. A semiconductor laser array structure as defined in claim 1, wherein:
    the waveguides have an interelement spacing approximately equal to an odd number of half-wavelengths of laterally traveling waves potentially generated in element regions of the array cells, whereby each array cell operates in or near the resonant condition; and
    the interarray regions have a lateral width approximately equal to an odd number of half-wavelengths of laterally traveling waves potentially generated in the element regions of the array cells, whereby the entire plurality of array cells operates in or near the resonant condition.

3. A semiconductor laser array structure as defined in claim 2, wherein:
    the interarray regions are approximately 10 to 60 micrometers in lateral width.

4. A semiconductor laser array structure as defined in claim 1, and further comprising:
    reflective means located at the ends of the interarray regions, to reflect light that would otherwise leak longitudinally from the structure, back into the interarray regions.

5. A semiconductor laser array structure as defined in claim 2, and further comprising:
    reflective means located at the ends of the interarray regions, to reflect light that would otherwise leak longitudinally from the structure, back into the interarray regions.

6. A semiconductor laser array structure as defined in claim 3, and further comprising:
    reflective means located at the ends of the interarray regions, to reflect light that would otherwise leak longitudinally from the structure, back into the interarray regions.

7. A semiconductor laser array structure capable of achieving high optical powers in a 0°-phase-shift array mode of operation, the structure comprising:
    means for producing lasing action in the structure, including a substrate, an active semiconductor layer and surrounding cladding layers successively formed on the substrate, at least two electrodes formed on opposite faces of the substrate, for applying a voltage across the active layer, and a pair of reflective facets, at least one of which is an emitting facet, formed at opposite ends of the array structure;
    a plurality of negative-index waveguide array cells, each having a plurality of negative-index waveguides with parallel longitudinal axes, and each array cell having interelement waveguide spacings selected to provide operation of each array cell at or near a 0°-phase-shift-array-mode resonance condition in which there is strong coupling between all waveguides in each array cell, a high degree of coherence in each array cell, and a virtually uniform near-field intensity profile;
    a plurality of interarray regions, each of which separates adjacent array cells by a distance wider than the interelement spacings between the waveguides in each array cell, and wherein each interarray region has a lateral width chosen to produce a 0°-phase-shift-array-mode resonance condition in the entire device, in which there is strong coupling between the array cells, a high degree of device coherence among all of the array cells, and a virtually uniform near-field intensity profile within each array cell;
    means for introducing losses in the interarray regions, to inhibit operation in array modes other than the 0°-phase-shift mode, whereby high optical powers are achieved without adversely affecting array mode discrimination; and
    reflective means located at the ends of the interarray regions, to reflect light that would otherwise leak longitudinally from the structure, back into the interarray regions.

8. A semiconductor laser array structure capable of achieving high optical powers in a 0°-phase-shift array mode of operation, the structure comprising:

a plurality of arrays of negative-index waveguides, each array having a plurality of negative-index waveguides configured to produce light in a longitudinal direction from the array and to operate in a 0°-phase-shift-array-mode resonance condition in which there is strong coupling, a high level of coherence among all of the waveguides in the array and a virtually uniform near-field intensity profile;

wherein adjacent ones of the arrays are separated by interarray regions having a width greater than the interelement regions in each array, and selected to provide operation at or near a 0°-phase-shift-array-mode resonance condition in which there is strong coupling, a high level of coherence among all of the arrays of the structure and a virtually uniform nearfield intensity profile within each array cell;

and wherein the interarray regions include means for introducing losses in these regions, to discriminate against operation in other than the 0°-phase-shift array mode.

* * * * *